(12) United States Patent
Davis

(10) Patent No.: US 6,879,191 B2
(45) Date of Patent: Apr. 12, 2005

(54) VOLTAGE MISMATCH TOLERANT INPUT/OUTPUT BUFFER

(75) Inventor: Jeffrey B. Davis, El Dorado Hills, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/649,261

(22) Filed: Aug. 26, 2003

(65) Prior Publication Data

US 2005/0046449 A1 Mar. 3, 2005

(51) Int. Cl.[7] ................................................ H03K 3/00
(52) U.S. Cl. ........................ 327/112; 327/333; 326/83
(58) Field of Search ........................ 327/108–112, 333; 326/62–83

(56) References Cited

U.S. PATENT DOCUMENTS

| 5,537,060 A | * | 7/1996 | Baek | ........................ 326/87 |
|---|---|---|---|---|
| 5,760,634 A | * | 6/1998 | Fu | ........................ 327/391 |
| 6,031,393 A | * | 2/2000 | Wayner | ........................ 326/81 |
| 6,130,556 A | * | 10/2000 | Schmitt et al. | ........................ 326/81 |
| 6,163,179 A | * | 12/2000 | Huang et al. | ........................ 327/108 |
| 6,188,243 B1 | * | 2/2001 | Liu et al. | ........................ 326/81 |

* cited by examiner

*Primary Examiner*—Kenneth B. Wells
(74) *Attorney, Agent, or Firm*—Marger Johnson & McCollom (57) ABSTRACT

Embodiments of the invention include a data buffer for connecting a core of a data circuit to a data pad. External devices may couple to the data pad even if they have a different power supply voltage than does the core of the data circuit. A pass transistor is coupled between the data pad and a data node in the buffer. A control circuit monitors a signal on the data pad and drives the pass transistor according to the signal received, thereby preventing damage due to voltage mismatch between the data circuit and the external device.

13 Claims, 8 Drawing Sheets

VOLTAGE MISMATCH TOLERANT INPUT/OUTPUT BUFFER

TECHNICAL FIELD

This disclosure is directed to data transfer circuits, and, more particularly, to an input/output buffer that is tolerant of voltage mismatch and provides protection against overvoltage.

BACKGROUND

Because of a desire to reduce power consumed by modern devices, maximum operating voltages of electronic devices have been decreasing over time. Several years ago common operating voltages for circuits were in the range of 5 volts or more, such as for TTL (Transistor-to-Transistor Logic) circuits. But more recently, the minimum power supply operating voltage for newer electronic devices may be much lower, e.g., in the range of 900 mVolts.

A problem arises when modern circuits are mated with legacy components in a single device, such as in a typical computer system. For instance, a hard disk controller may operate at 900 mVolts, but the disk drive that it is controlling may be older and continue to operate from a 5 volt power supply. One reason for the supply voltage mismatch is that not all components of a computer system are simultaneously updated.

A problem exists because a standard power supply for a particular device may provide a supply voltage that is too high or too low for interoperability with other components in the same system. Exposing a circuit to a voltage higher than it is designed for may electrically or physically compromise the circuit. Driving a circuit at a voltage lower than it is designed for may cause data errors, because data signal levels are not high enough to be detected. Either condition is problematic.

Embodiments of the invention address this and other limitations of the prior art.

BRIEF DESCRIPTION OF THE DRAWINGS

The invention will be understood more fully from the detailed description given below and from the accompanying drawings of embodiments of the invention. These descriptions, however, should not be taken to limit the invention to the specific embodiments, but are to facilitate explanation and understanding.

DETAILED DESCRIPTION

In the following detailed descriptions, numerous specific details are set forth to provide a thorough understanding of the invention. It will be understood by those skilled in the art, however, that the present invention may be practiced without these specific details. In other instances, well-known methods, procedures, components and circuits have not been described in detail so as not to obscure the present invention.

Embodiments of the invention are directed toward a device that includes a data buffer, also referred to herein as an I/O circuit, that may translate data between two circuits or devices having different operating voltages. Data generating circuits in a chip core generate data and send it to the data buffer. The data buffer then transfers the data to a data pad (or, in newer devices, a data bump) where an external device may properly read the data, even if the external device operates at a voltage different from the power supply voltage of the chip core. Additionally, the external device may generate and send data to the chip core. In these instances, the external device generates data and applies it to the data pad. The data buffer accepts the data from the pad and transfers it to a data node within the data buffer. Data may be then sent from the data node to the chip core. As is fully described below, due to the structure of the data buffer according to embodiments of the invention, the data buffer is tolerant of voltage mismatch between the external device and the chip core, no matter in which direction the data travels, or even data traveling only in a single direction.

A benefit of such a circuit is that it is extremely tolerant of overvoltage tolerance, e.g., where a high voltage data signal is applied to the data pad as an input signal. In prior art circuits, the voltage of the input data signal would be too high, causing damage to the data buffer. Instead, embodiments of the invention are specifically equipped to accommodate this overvoltage, and to use the input data signals as valid data input.

Figure 1:
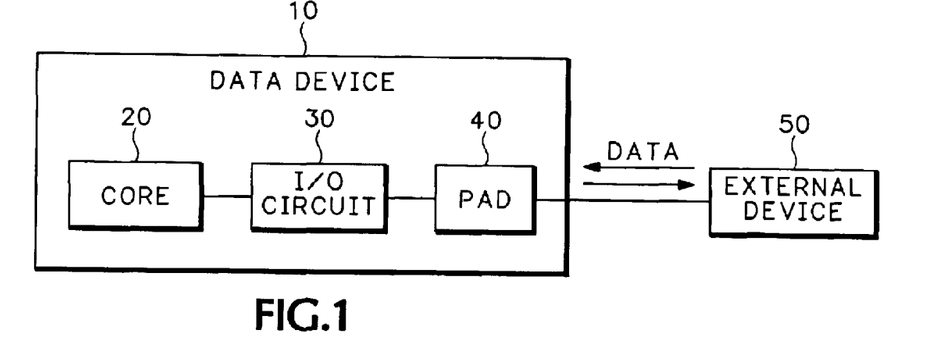
FIG. 1 is a functional block diagram of data circuit including an embodiment of the invention.

FIG. 1 is a functional block diagram of data device 10 including an embodiment of the invention. The data device 10 includes a chip core 20, an I/O data buffer circuit 30, and a data terminal, such as a data bump or data pad 40. An external device 50 couples to the data pad 40 of the data device 10. In operation, the external device 50 shares data with the data device 10. The data device 10 may generate data for the external device 50, such as generating printer data for a printer. Or, the external device 50 may generate data for the data device 10, such as by reading data from a hard disk drive or CD-ROM drive. Of course, in nearly every case, data and/or commands flow in both directions, i.e., both the data device 10 and the external device 50 generate data for and receive data from the other. In some embodiments, the external device 50 may be an interface to another device. For instance, the external "device" 50 may be a pin or trace on an IDE (Integrated Device Electronics) bus. For purposes of the invention, the external device 50 may be almost any type of device or interface that generates and/or receives data.

One scenario particularly well suited to benefit from embodiments of the invention is for combining a new data device 10 with a legacy external device 50. In most computer systems, development of core logic data devices 10 typically precedes development of external devices 50. Therefore, the data devices 10 may operate at a lower power supply voltage than the external devices 50. Also, oftentimes data devices 10 do not couple directly to external devices 50 themselves, but rather couple to interfaces to those devices. For example, the data pad 40 may couple to an IDE bus, which in turn is coupled to a hard disk. Thus, even when the data devices 10 have been redesigned for more efficient operation, they often must still support legacy systems that were not designed using the latest technology. For example, the data device 10 may operate with a 1 volt power supply, while the external device 50 uses a 3.3 or 5 volt power supply. Thus, in this case, the data device 10 is in danger of being connected to a large outside voltage and could suffer physical damage.

Likewise, the external device 50 may have a problem in sensing data differences at the data pad 40 between the data device 10 generating a data "0" or LOW data signal and a data "1" or HIGH data signal. Specifically, because of power supply voltage mismatch between the data device 10 and the external device 50, a voltage in the data device 10 that is generated to be a HIGH logic signal (e.g., 1.5 volts) may still be below the lowest threshold voltage of a HIGH logic signal in the external device 50 (e.g., 2.0 volts).

Figure 2:
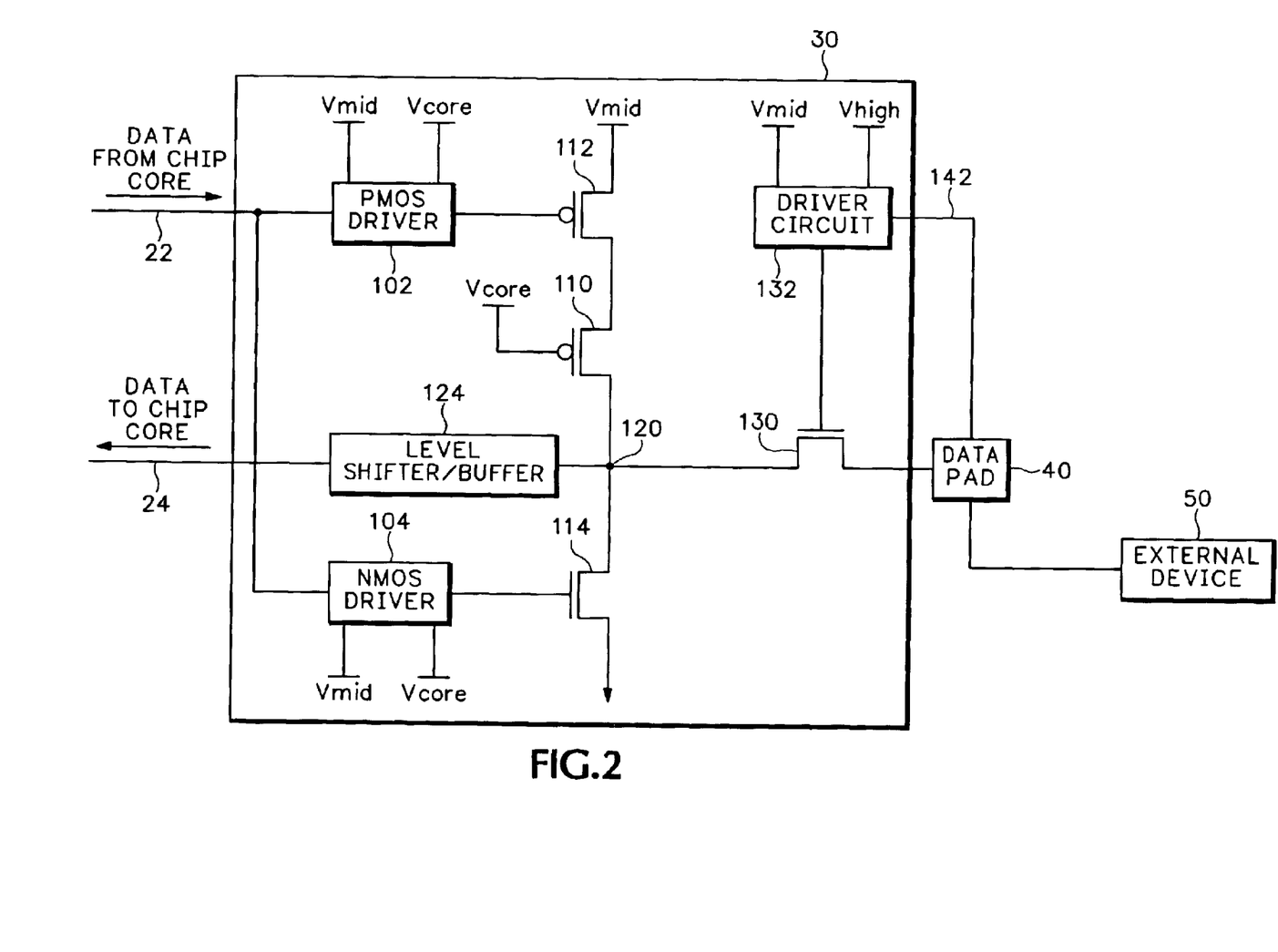
FIG. 2 is a more detailed schematic circuit diagram of a portion of the data circuit of FIG. 1.

FIG. 2 is a schematic diagram showing a portion of the data device 10 of FIG. 1. Specifically, a detailed example of the I/O circuit 30 is shown, as well as the pad 40 to which both the I/O circuit 30 and an external device 50 are connected. The I/O circuit 30 is coupled to the chip core 20 through data lines 22 and 24. The chip core 20 generates data and places it on the data line 22. The I/O circuit 30 receives the data from the data line 22 and transfers it to the data pad 40 for use by the external device 50. Similarly, the external device 50 generates data and places it on the data pad 40. The I/O circuit 30 senses the data from the data pad 40 and sends it to the chip core 20 over the data line 24.

Common ranges of signaling voltages generated by the chip core 20 include, depending on the maximum power supply voltage of the chip core 20: zero to 900 mV, zero to 1.2 volts, zero to 1.5 volts, zero to 1.8 volts, zero to 2.5 volts, zero to 3.3 volts or zero to 5 volts. If the chip core 20 generates a LOW data signal, the voltage on the data line 22 is near the lower end of the selected range, i.e., near zero volts. Conversely, if the chip core 20 generates a HIGH data signal, the voltage on the data line 22 is near the upper end of the range, i.e., 900 mV, 1.2V, 1.5V, 1.8V, 2.5V, 3.3V, or 5V, depending on which power supply voltage is used. For the example described below, it is assumed that the chip core 20 operates at a power supply voltage of 1.5 volts and the external device operates at a power supply voltage of 5 volts. Thus, data signals on the data line 22 will have a voltage between zero to 1.5 volts, although any of the above ranges, and others, are possible.

As illustrated in FIG. 2, the data signal line 22 is provided to a PMOS driver circuit 102 and to an NMOS driver circuit 104. The driver circuits 102, 104 are also coupled to two power supply voltages, Vcore and Vmid. The voltage of Vcore equals the power supply voltage that is supplied to the chip core 20, for instance, 1.5 volts. The voltage Vmid is a voltage that is between Vcore and a power supply voltage used by the external device 50. For the example below described, the power supply voltage of the external device 50 will be 5 volts, the Vcore 1.5 volts, and the Vmid approximately 3.3 volts. Of course, these are only example voltages and the I/O buffer 30 operates in a similar manner with different supply voltages. The selection of particular supply voltages is implementation specific and left to the circuit designer for the particular application in which the embodiments of the invention appear.

The PMOS driver circuit 102 drives a first PMOS transistor 112, which is connected between the Vmid power supply voltage and a second PMOS transistor 110. As described below, the PMOS driver circuit 102 generates a signal to drive the PMOS transistor 112 based on the signal that the driver circuit 102 receives on the data line 22. The gate of the second PMOS transistor 110 is not specifically controlled, but rather may be constantly coupled to the Vcore power supply voltage. The combination of the first PMOS transistor 112 and second PMOS transistor 110 shares a voltage drop between the voltage Vmid, which is coupled to the first PMOS transistor 112, and a voltage at a node 120, which may be at ground or slightly negative. Additionally, connecting the gate of the second PMOS transistor 110 to the core voltage assures safe operation of the PMOS transistors 112, 110 during all operating modes of the I/O buffer 30.

The NMOS driver 104 drives the gate of an NMOS transistor 114 based on the signal provided to the driver circuit 104 on the data line 22. The NMOS transistor 114 is coupled between the second PMOS transistor 110 and a reference voltage, for example a ground reference. The node 120, which is where the PMOS transistor 110 and the NMOS transistor 114 meet, is referred to as a data node, because that is where data appears before it is sent to the data pad 40. Additionally, as discussed below, when the I/O buffer 30 is operating in input mode, data is transferred from the pad 40 to the data node 120, where it is then transferred to the chip core over the data line 24.

Figure 7:
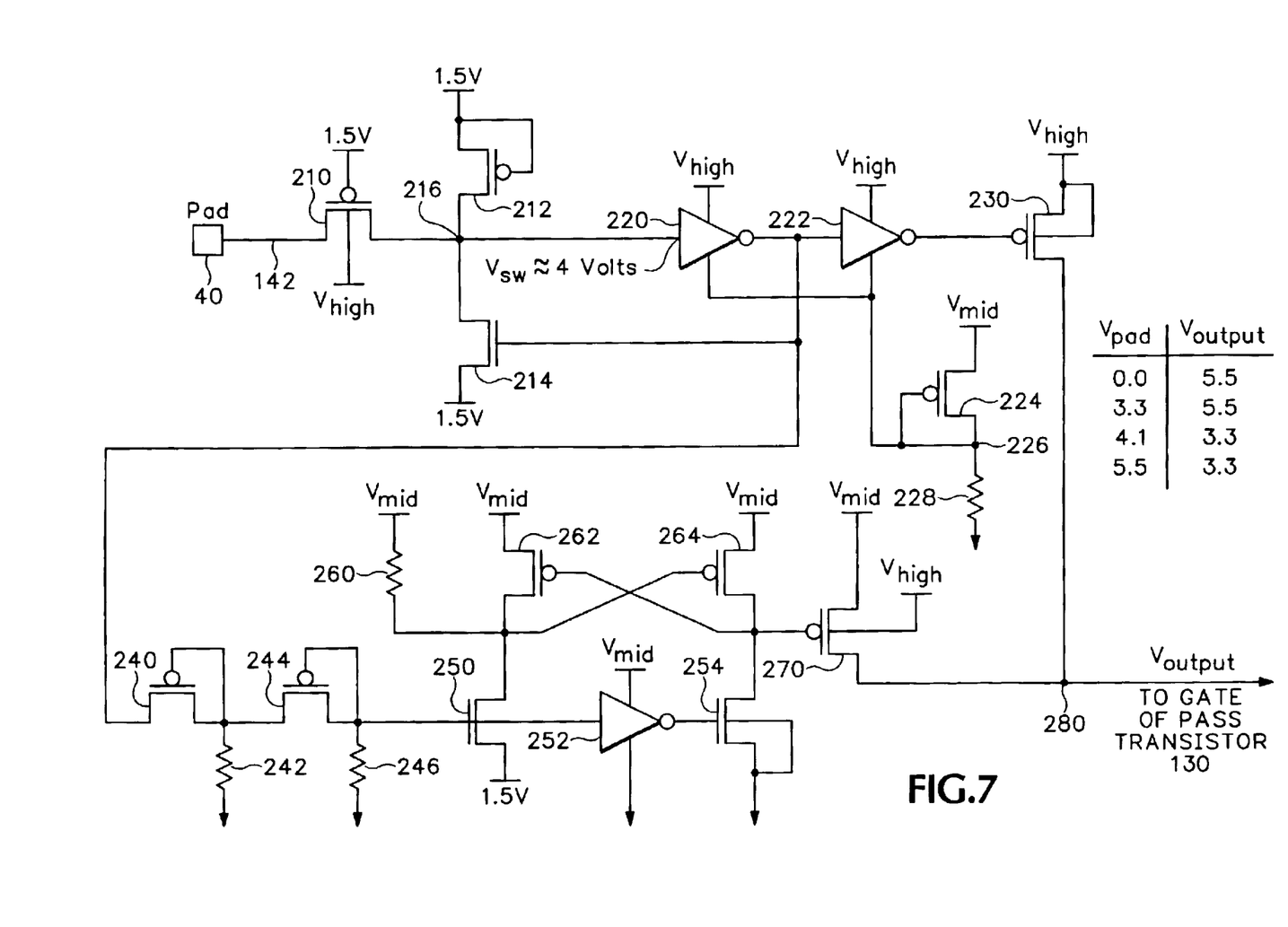
FIG. 7 is a more detailed schematic circuit diagram of an exemplary driving circuit for use with the embodiment of FIG. 2.

The data node 120 is coupled to the pad 40 through a series pass transistor 130, which is driven by a driver circuit 132. Discussion of the driver circuit 132 follows, and a particular implementation of the driver circuit 132 is shown in FIG. 7. In some embodiments, any or all of the transistors 110, 112, 114 and 130 may be formed of thick oxide transistors.

In general, the I/O buffer 30 operates to transition data from the chip core 20 to the data pad 40 when in output mode, and to protect the I/O buffer 30 and to transition data from the data pad 40 to the chip core 20 when in input mode. More specifically, the I/O buffer 30 receives the data from the data line 22 and transfers it to the data pad 40 for use by the external device 50. The PMOS driver circuit 102 and NMOS driver circuit 104 sense the data signal from the data line 22 and generate appropriate signals to drive their respective transistors 112, 114. When the transistors 112, 110, and 114 are properly driven, the data node 120 contains the proper data to be output to the pad 40. The driver circuit 132 produces the signals necessary to cause the pass transistor 130 to drive the signal from the data node 120 to the pad 40, where the external device 50 may read the data that was produced by the chip core 20.

When the I/O buffer 30 is in the input mode, the driver circuit 132 drives the pass transistor 130 to cause data to move from the pad 40 to the data node 120. From the data node 120, the data is further sent to the chip core 20 over the data line 24.

There are three transistor driving circuits in the I/O circuit 30 that are illustrated in FIG. 2, specifically the PMOS driving circuit 102, the NMOS driving circuit 104, and the driver circuit 132. The operation of the each of the driving circuits 102, 104, 132 depends on the supply voltages to which they are attached, and a data signal that they receive.

The driving circuits 102 and 104 are each coupled to Vcore and Vmid, and each receives a data signal from the data line 22. With reference to the driving circuit 102, depending on the data signal from the data line 22, the driving circuit 102 drives the PMOS transistor 112 with either a voltage approximately equal to Vcore, or a voltage approximately equal to Vmid. Specific examples are given below with respect to FIGS. 3 and 4. Similarly, the driving circuit 104 generates voltages between approximately zero volts and the voltage Vmid to drive the NMOS transistor 114. The driving circuits 102 and 104 may be implemented by voltage translators, the functions of which are known in the art.

The driving circuit 132 is coupled to the reference voltage Vmid as well as to a power supply voltage Vhigh, which is the power supply voltage of the external device 50 in the example described below. A pad level sensor line 142 provides an input of the present voltage of the data pad 40. When operating, the driving circuit 132 monitors the voltage on the data pad 40 and, from this information, determines a proper level at which to drive the gate of the pass transistor 130.

Four specific data transfer scenarios are possible when the I/O buffer 30 is operating-outputting either a LOW or a HIGH signal to the pad 40, and inputting either a LOW or a HIGH signal from the pad 40. Each of the cases is individually discussed below with reference to FIGS. 3–6. As mentioned above, the examples explained below have a Vcore of about 1.5 volts, a Vmid of about 3.3 volts, and a Vhigh, which is the power supply voltage of the external device 50 of about 5.0 volts, although many different voltage combinations are possible with the I/O buffer 30 according to embodiments of the invention.

Figure 3:
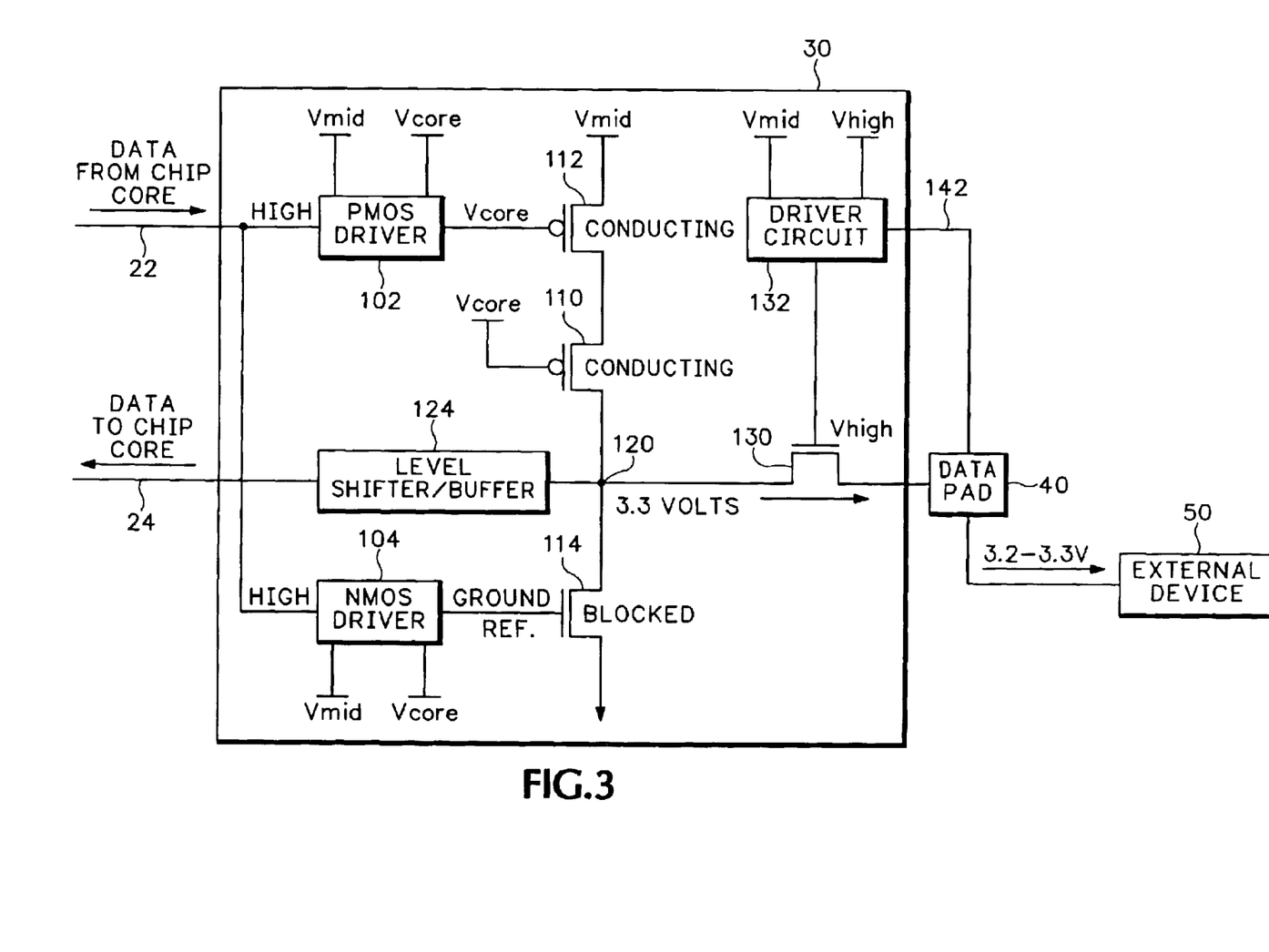
FIGS. 3–6 are schematic circuit diagrams illustrating the embodiment of FIG. 2 in various operating modes.

FIG. 3 is a schematic circuit diagram illustrating the embodiment of FIG. 2 when the I/O buffer 30 is driving the pad 40 with a logic HIGH signal.

To output a logic HIGH signal to the pad 40, the chip core 20 first places a HIGH voltage level signal on the data line 22. The driving circuits 102 and 104 sense this signal and generate the proper driving signals for their respective transistors. Specifically, the driving circuit 102 produces a driving signal of Vcore, or about 1.5 volts, and the driving circuit 104 outputs an approximate zero volt ground reference voltage. As illustrated in FIG. 3, the gate of the transistor 110 is coupled to the Vcore voltage of about 1.5 volts.

Under these gate driving conditions, the PMOS transistor 112 turns ON and conducts because its gate voltage is about 1.5 volts and its source is connected to the Vmid, or about 3.3 volts. This conduction charges the source terminal of the PMOS transistor 110 to about 3.3 volts as well. Because the gate of the transistor 110 is coupled to the Vcore of 1.5 volts, this PMOS transistor 110 also turns ON and conducts, which charges the data node 120 to about 3.3 volts. The PMOS transistors 112 and 110 thus form a pull-up circuit. The NMOS transistor 114 has zero volts applied to its gate, and is therefore OFF and not conducting. Thus, the data node 120 remains charged at approximately 3.3 volts, because the PMOS transistor 110 charged it up to about 3.3 volts, and because the data node 120 is cut off from a discharge path to ground.

The driving circuit 132 generates the appropriate signals to drive the series pass transistor 130. For the external device 50 to correctly sense a HIGH signal at the pad 40, the data signal should pass from the data node 120 to the pad 40 with as little voltage loss as possible. This is especially true if the external device 50 operates with a higher power supply voltage than does the chip core 20, as in this example. Therefore, the driving circuit 132 drives the series transistor 130 at a level to adequately generate the signals for the external device 50. In some embodiments of the invention, the driving circuit 132 drives the series transistor 130 with Vhigh, which, in this example, is about 5.0 volts.

For embodiments of the invention that are implemented in a computer system, a 5.0 voltage is a common supply voltage, and most likely would not need to be generated by the chip or circuit that includes the I/O buffer 30. The voltage generated by the driving circuit 132 could be generated from other voltages on the chip, using known techniques, if the Vhigh voltage were not readily available to the I/O buffer 30.

Therefore, in this example, because the gate of the NMOS pass transistor 130 is driven with about 5.0 volts, the 3.3 volt signal at the data node 120 is transferred with a very small or no voltage loss to the data pad 40. Thus, a voltage of about 3.2 or 3.3 volts is applied to the pad 40. This is enough for the external device 50 to sense the voltage at the pad 40 as a HIGH signal, even if the external device operates with a 5 volt power supply voltage. Thus, in this scenario, the data has effectively been correctly transferred out of the chip core 20, through the I/O buffer 30, and to the pad 40, where it is read by the external device 50.

Figure 4:
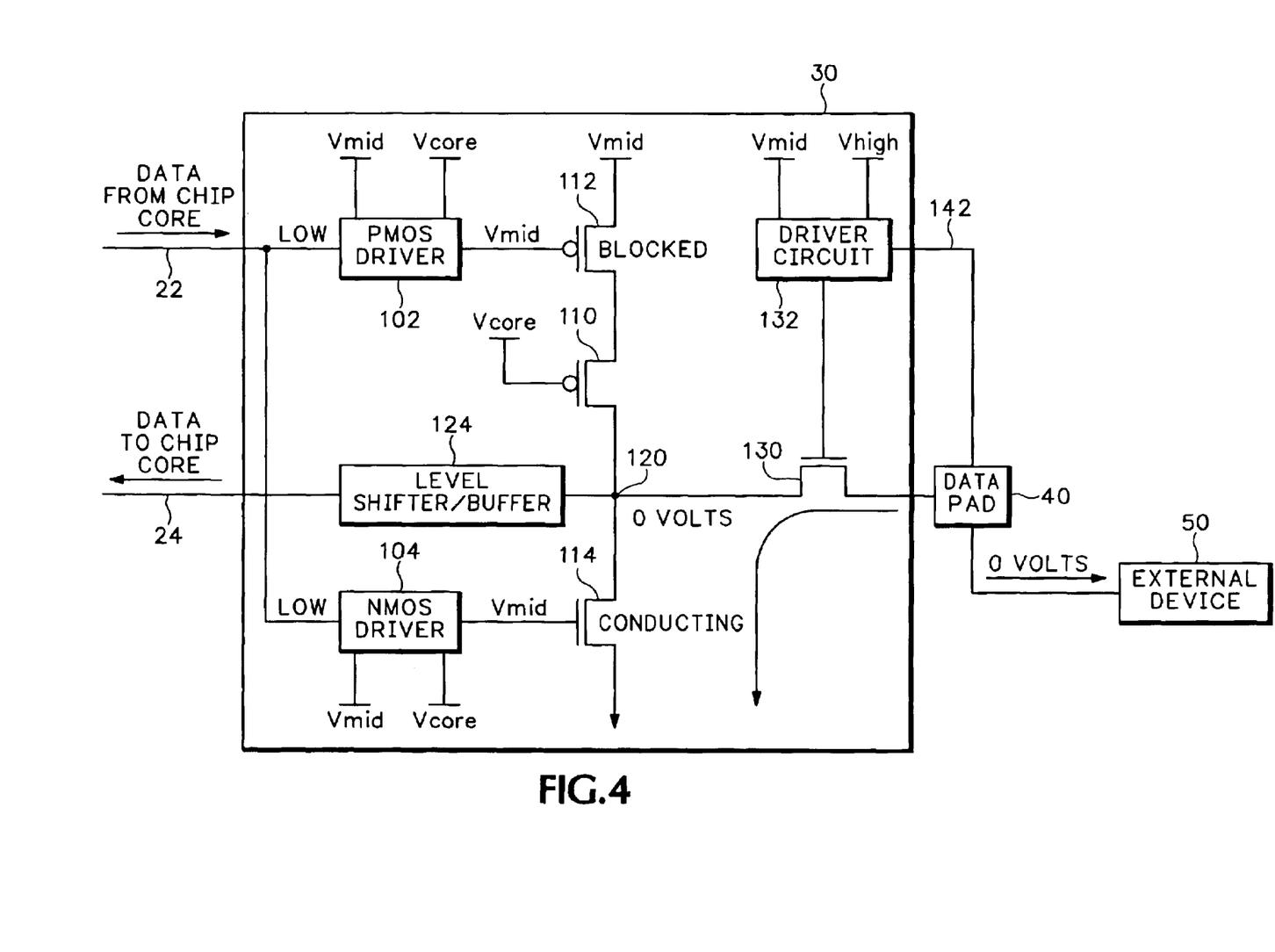

FIG. 4 is a schematic circuit diagram illustrating the embodiment of FIG. 2 when the I/O buffer 30 is delivering a logic LOW signal to the pad 40.

When the I/O buffer 30 outputs a LOW signal at the pad 40, the chip core 20 first places a LOW signal (at or near the ground level voltage) on the data line 22. The driving circuit 102 senses this and generates a voltage of about Vmid, or 3.3 volts for the gate of PMOS transistor 112. The driving circuit 104 also generates a signal of about Vmid, or 3.3 volts to drive the NMOS transistor 114. The gate of the transistor 110 remains coupled to the Vcore, or about 1.5 volts.

Therefore, under these conditions, the PMOS transistor 112 is turned OFF because it has about 3.3 volts applied to its gate and its source is connected to the Vmid power supply voltage of about 3.3 volts. The NMOS transistor 114 has the Vmid power supply voltage of 3.3 volts on its gate, and its source is coupled to ground. Therefore, the NMOS transistor 114 is conducting while the PMOS transistor 112 is blocked, and the data node 120 is discharged to the ground reference of zero volts. In this instance, the NMOS transistor 114 is operating as a pull-down circuit.

To apply the zero volt signal at the data node 120 to the pad 40, the driver circuit 132 turns on the pass transistor 130. This effectively discharges any voltage at the pad 40 through the NMOS transistor 114, and brings the pad 40 to ground, or zero volts. To turn on the pass transistor 130, the driver circuit 132 may drive the pass transistor 130 at any voltage that causes the pass transistor 130 to conduct. For reasons described below, this embodiment drives the pass transistor 130 with the Vhigh voltage of about 5–5.5 volts, which turns on the pass transistor 130, and discharges the pad 40 through the transistor 114 to ground. Thus, in this scenario, the I/O buffer 30 has correctly transferred the LOW signal generated by the chip core 20 to the pad 40, for use by the external device 50.

Figure 5:
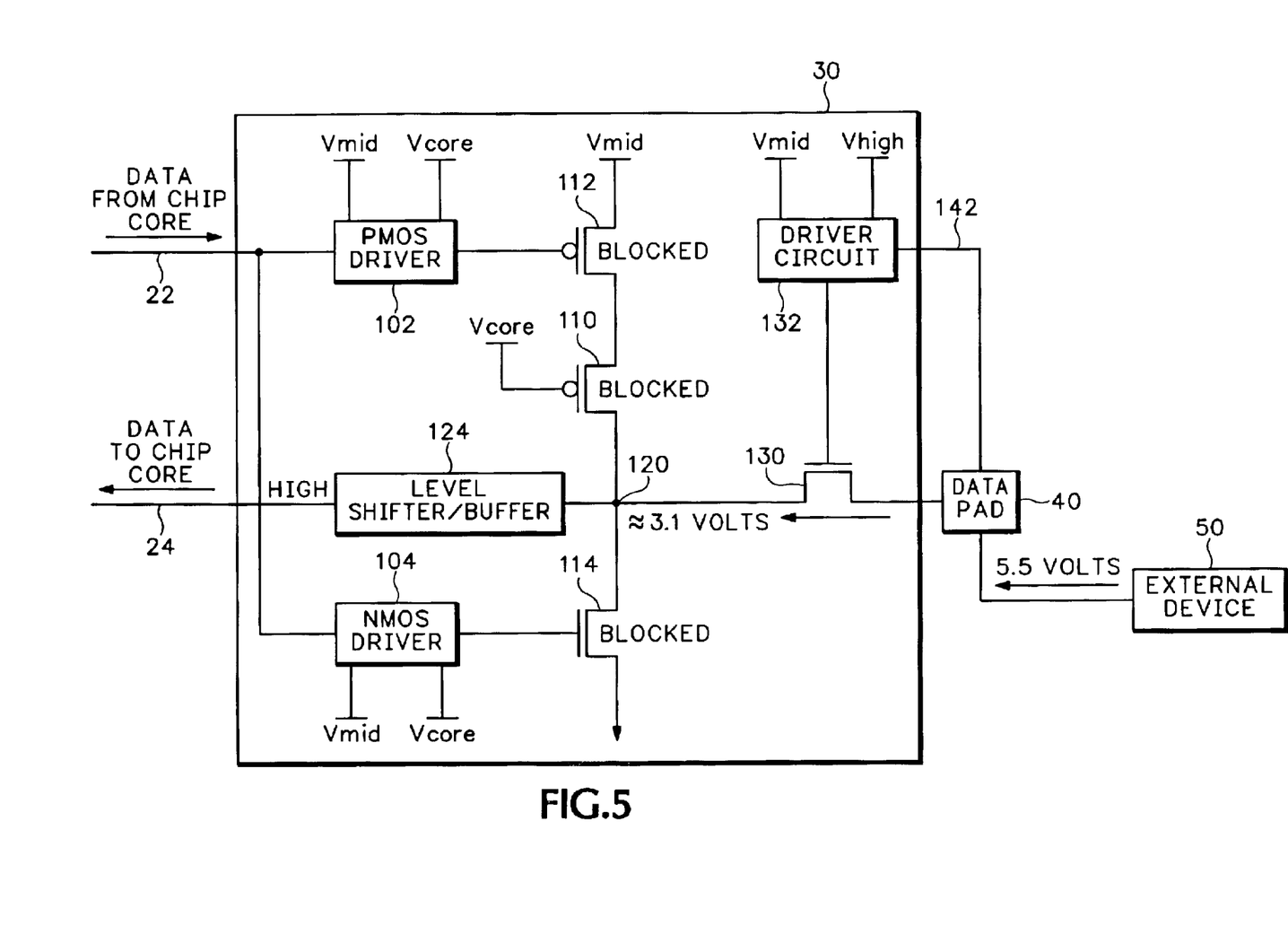

FIG. 5 is a schematic circuit diagram illustrating the embodiment of FIG. 2 when the I/O buffer 30 is receiving a logic HIGH signal from the pad 40 that was generated by the external device 50. In this mode, the I/O buffer 30 also protects the chip core 20 (FIG. 1) and the I/O buffer 30 itself from overvoltage from the external device 50.

The examples described above with reference to FIGS. 3 and 4 illustrated scenarios when the chip core 20 was generating data for the external device 50. The I/O buffer 30 according to embodiments of the invention is equally effective at receiving data signals from the external device 50, even when the external device is operating at a different voltage than the chip core 20.

In this example, assume that the external device 50 places a 5.5 volt signal on the pad 40. A 5.5 volt signal may be the maximum voltage signal that would be generated in a system with a 5 volt power supply and a 10% tolerance overvoltage condition.

The driver circuit 132 receives the signal from the pad 40 on the voltage sensing line 142. In this embodiment, the driver circuit 132 drives the gate of the pass transistor 130 at either the Vmid or Vhigh voltages, depending on the voltage level at the pad 40. When the pad 40 has a voltage higher than a threshold voltage, for example over 3.75 volts, the driver circuit 132 applies the Vmid voltage, or between about 3.0–3.6 volts (3.3 volts nominal plus or minus 10% threshold), to the gate of the pass transistor 130. Conversely, when the pad 40 has a voltage lower than the threshold voltage, the driver circuit 132 applies the voltage Vhigh to the gate of the pass transistor 130.

With the Vmid voltage of about 3.6 volts applied to the gate of the pass transistor 130, the pass transistor 130 turns ON, and charges the data node 120 to a voltage of approximately Vg–Vt, which is approximately 3.6 minus 0.5 volts, or about 3.1 volts. In this case, the transistors 112, 110, and 114 are all held OFF, so the data node 120 remains charged at approximately 3.1 volts. The bulk of the PMOS 110 is coupled to Vmid to prevent its drain-bulk junction from becoming forward biased under this condition.

This voltage can be safely translated down to the data core 20 operating voltages through a level shifter or other type of data buffer 124, as is known in the art. The output signal from the data buffer 124 drives the data line signal 24, which is fed back to the chip core 20.

Thus, in this scenario, even though a 5.5 volt signal is presented on the data pad 40, only a voltage of about 3.1 volts appears at the data node 120 of the I/O buffer 30, which is further translated down to a data that can be safely read by the core voltage.

Figure 6:
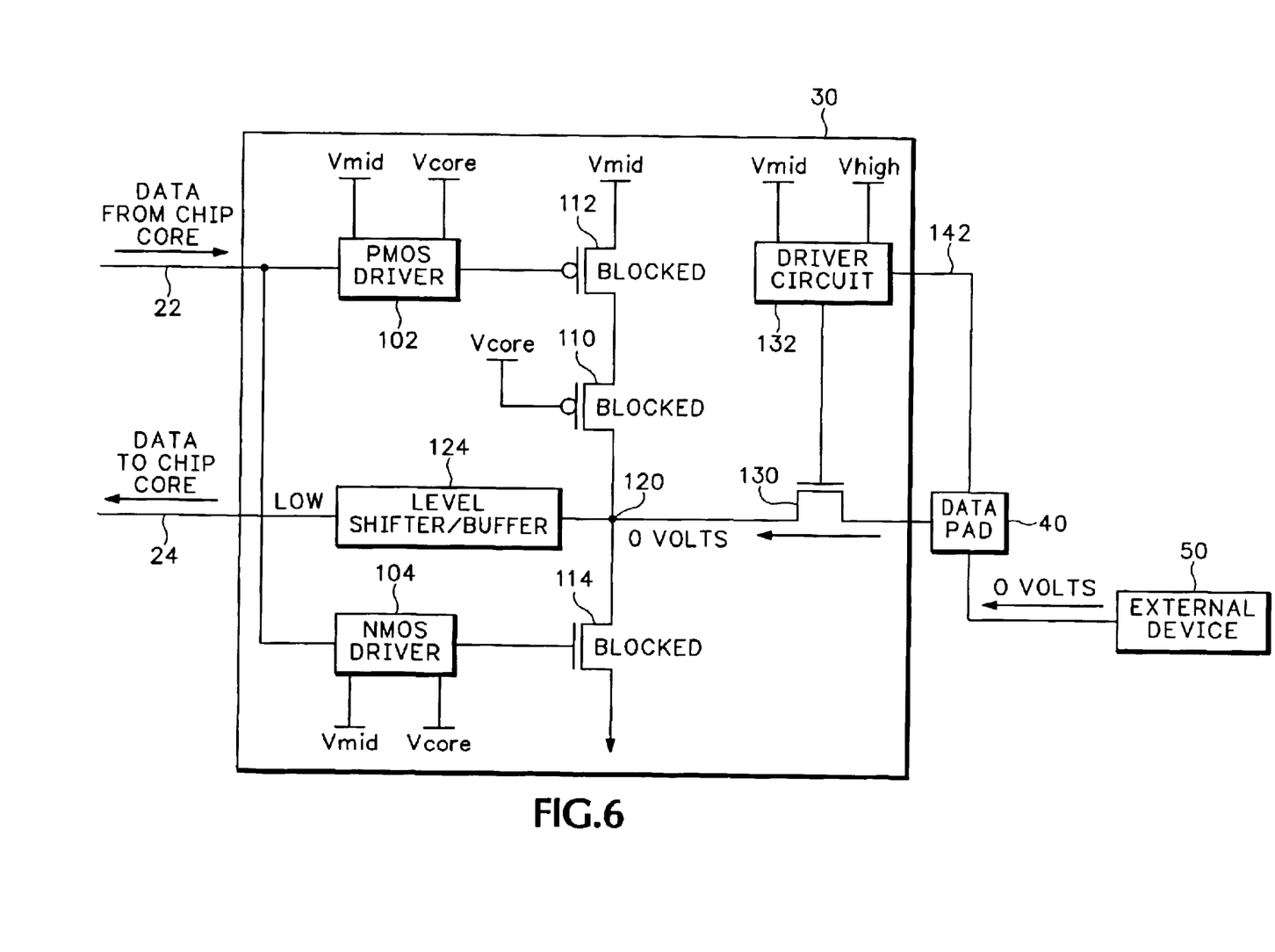

FIG. 6 is a schematic circuit diagram illustrating the embodiment of FIG. 2 when the I/O buffer 30 is receiving a logic LOW signal from the pad 40.

When receiving a LOW signal from the pad 40, the external device 50 places a zero or slightly below zero volt signal on the pad 40.

The driver circuit 132 receives the voltage signal from the pad 40 from the voltage sensing line 142. Because the pad 40 has a voltage lower than the threshold voltage (3.75 volts in this example), the driver circuit 132 outputs a driving signal of Vhigh, or about 5.0 volts. This driving signal of 5.0 volts from the driver circuit 132 is applied to the gate of the pass transistor 130. The pass transistor 130 conducts, and the pad 40 voltage of approximately zero volts is passed to the data node 120. Of course, the driver circuit 132 could also drive the pass transistor 130 at a Vmid voltage, which would also cause the pass transistor 130 to transfer the LOW data from the data pad 40 to the data node 120.

As above, when in receive mode, the transistors 112, 110, and 114 are all held OFF, or very nearly OFF, so that the data node 120 retains the zero volts or other slightly negative voltage that was at the pad 40.

This voltage can be sent through the data buffer 124, to the chip core 20.

Thus, in this instance, the I/O buffer 30 according to embodiments of the invention, properly receives a LOW signal from the external device 50, and passes it to the chip core 20.

FIG. 7 is a schematic diagram of an example embodiment of the driving circuit 132 illustrated in FIG. 2. In general, as described above, the driving circuit 132 generates an output voltage to drive the gate of the pass transistor 130 when the I/O circuit 30 is in operation. In the embodiment described below, the driving circuit 132 outputs a voltage of 5.5 volts if the voltage at the pad 40 is below 4.0 volts, and outputs a voltage of 3.3 volts if the voltage at the pad 40 is above 4.0 volts. Of course, it is possible to tune the driving circuit 132 to generate different voltages or to switch at different voltages.

In the embodiment of the driving circuit 132 illustrated in FIG. 7, the voltage sensing line 142 couples the pad 40 to the remainder of the driving circuit 132. The voltage sensing line 142 leads to the source of a PMOS transistor 210, which includes a gate tied to approximately 1.5 volts. Of course, the gate could also be tied to other voltages in other embodiments. The bulk of the PMOS transistor 210 is coupled to a Vhigh voltage, which in this embodiment may be 5.5 volts.

The drain of the PMOS transistor 210 is tied to an inverter 220, which operates differently than a standard inverter. Specifically, the switching threshold voltage of the inverter 220 is set to approximately 4.0 volts, and not to a midpoint between the high and low voltage "rails" connected to the inverter. One way to set a threshold switching voltage in an inverter is to vary the physical dimensions of the transistors used to make up the inverter, as is known in the art. Other methods include altering the doping levels of the transistors. Thus, when a voltage less than the switching voltage is applied to the input of the inverter 220, the output is set to a voltage approximately equal to Vhigh. Conversely, when a voltage greater than the switching voltage is applied to the input of the inverter 220, the output is set to a voltage approximately equal to a voltage at a node 226, which is described below.

The output of the inverter 220 is coupled to another inverter 222. The voltage sources of the inverter 222 are the same as the voltage sources for the inverter 220, i.e., the high voltage is coupled to Vhigh, and the low voltage is coupled to the node 226.

The voltage at the node 226 is set by the operating parameters of a PMOS transistor 224, which is coupled between a Vmid voltage of, for example, 3.3 volts, and the node 226. The gate of the transistor 224 is also coupled to the node 226. A resistor 228 is coupled between the node 226 and a ground reference, for example 0 volts. In the embodiment illustrated in FIG. 7, the resistor 228 has a high resistance and thus draws a low current. Therefore, the voltage at the node 226 is related to the turn-on voltage of the transistor 224. If the Vmid voltage is 3.3 volts, the voltage at the node 226 is approximately equal to 3.3 volts less the absolute value of the threshold voltage of the transistor 224, or $V_{226}=3.3-\text{abs}(Vtp)$.

The output of the inverter 222 is coupled to a gate of a PMOS transistor 230, which is coupled between the Vhigh voltage and an output node 280. In operation, briefly, the portion of the driving circuit 132 made up of the transistors 210, 212, 214, inverters 220 and 222, the transistor 224, and the transistor 230, hereinafter called the first portion, charges the output node 280 to Vhigh, or turns OFF transistor 230 so it does not contribute to setting the voltage at the output node 280.

A second portion of the driving circuit 132 includes two serial PMOS transistors 240, 244, a level shifting circuit made up of an NMOS transistor 250, an inverter 252, an NMOS transistor 254, a resistor 260, cross-coupled PMOS transistors 262 and 264, and an output transistor 270. In short, the second portion of the driving circuit 132 causes either the Vmid voltage to be applied to the output node 280, or is blocked. Operating in conjunction with the first portion of the driving circuit 132, described above, the entire driving circuit 132 provides a voltage signal at the output node 280 of either Vhigh or of Vmid, which is used to drive the gate of the pass transistor 130, as described above with reference to FIGS. 2–6. In the embodiment described above, the Vhigh voltage is approximately 5.5 volts and Vmid is approximately 3.3 volts, although other voltages could be used.

Next, the operation of the driving circuit under various example operating conditions will be described. Specifically, when the voltage at the pad 40 is below the switching voltage of the inverter 220, in this case 4.0 volts, then the driving circuit 132 applies the Vhigh voltage to the output node 280. Similarly, if the voltage at the pad 40 is above the switching voltage of the inverter 220, then the driving circuit 132 applies the Vmid voltage to the output node 280.

If the voltage at the pad 40 is less than $Vg_{210}+abs(Vtp_{210})$, for example 0 volts, the transistor 210 is non-conducting because the Vgs voltage is a positive 1.5 volts. In this case, leakage transistor 212 causes a node 216 to be set to approximately 1.5 volts. Therefore, a low voltage signal of about 1.5 volts is applied to the input of the inverter 220, which is well below the switching voltage of 4.0 volts. Because the high rail of the inverter 220 is coupled to Vhigh, the inverter 220 outputs a Vhigh voltage and applies it to the input of the inverter 222 and to the gate of level restoring transistor 214. The inverter 222 thus outputs a voltage approximately equal to its low rail, which is the voltage at the node 226. The node 226 is held to about 2.7 volts due to the diode connected PMOS transistor 224 and the high resistance resistor 228. Therefore, the transistor 230 has approximately 2.7 volts applied to its gate, and its source is connected to Vhigh, so it turns ON fairly hard to drive the output node 280 to approximately 5.5 volts.

The same portion of the driving circuit 132 operates similarly when the pad voltage is 3.3 volts, except that in that case the transistor 210 is conducting. The leakage transistor 212 has little effect on the output voltage of the transistor 210 in this case. Because the highest voltage (3.3 volts) that can be applied to the input of the inverter 220 is still below the switching voltage of 4.0 volts, the output of the inverter 220 is HIGH. Thus, the remainder of the first portion of the driving circuit 132 operates the same, and 5.5 volts is applied to the output node 280.

When the pad voltage is below the switching voltage of the inverter 220, a Vhigh signal is applied to the source of the PMOS transistor 240 from the output of the inverter 220. The transistors 240 and 244 clamp the voltage applied to the gate of the NMOS transistor 250 at approximately 4.5 volts. This turns ON the transistor 250, which has its source coupled to an approximate 1.5 volt reference.

Because the drain of the transistor 250 is pulled to approximately 1.5 volts, and this node is connected to the gate of the PMOS transistor 264, which has a source voltage of approximately Vmid, the transistor 264 turns ON. The transistor 254 is blocked or non-conducting because the output from the inverter 252 is LOW, which is applied to the gate of the NMOS transistor 254.

The transistor 262 is likewise blocked because the drain of the transistor 264 is charged to approximately the Vmid voltage through the ON transistor 264. Thus, the transistor 262 has approximately the Vmid voltage at its gate and also at its source, and is therefore blocked and not conducting.

Likewise, because the drain of the transistor 264 is charged to approximately the Vmid voltage, the transistor 270 has the Vmid voltage applied to its gate and source, and is therefore blocked, and doesn't interfere with the operation of the first portion of the driving circuit 132, as described above.

When the driving circuit 132 senses 3.3 volts on the pad 40, by virtue of the elevated switch point of inverter 220, the second portion of the circuit operates the same as when there are 0 volts on the pad 40, and the output transistor 270 is also blocked.

Thus, when either 0 or 3.3 volts are sensed at the pad 40, the first portion of the driving circuit 132 causes the transistor 230 to charge the output node 280 to approximately the Vhigh voltage, and the transistor 270 in the second portion of the driving circuit 132 is blocked. The bulk of transistor 270 is coupled to Vhigh to prevent its drain-bulk junction from becoming forward biased under this condition.

If, however, the voltage sensed at the pad 40 is above the switching threshold of the inverter 220, which in this embodiment is approximately 4.0 volts, the transistor 270 in the second portion of the driving circuit 132 will set the output voltage at the output node 280 to approximately 3.3 volts, while the transistor 230 in the first portion of the driving circuit 132 is blocked, as described in detail below.

For example, if the voltage sensed at the pad 40 is 4.1 volts, then the transistor 210 conducts and a voltage approximately 4.1 volts is applied to the input of the inverter 220. This causes the output of the inverter 220 to be equal to its low rail voltage, described above, which is approximately 2.7 volts. This causes the inverter 222 to generate an output signal of Vhigh, which, when applied to the gate of the PMOS transistor 230, turns the transistor 230 OFF. The same is true when the voltage sensed at the pad 40 is greater than 4.1 volts, for instance 5.5 volts.

In the second portion of the driving circuit 132, when the voltage sensed at the pad 40 is 4.1 volts, the inverter 220 outputs a voltage signal of about 2.7 volts, which is applied to the source of the PMOS transistor 240. The transistors 240 and 244 operate as a DC voltage drop to cause a voltage of about 1.7 volts or a little less to be applied to the transistor 250, which is therefore in a non-conducting state because its source is coupled to a voltage of approximately 1.5 volts.

Since the 1.7 volt or less signal from the drain of the transistor 244 is also applied to the inverter 252, the inverter 252 generates an output signal approximately equal to its high rail, which is a Vmid voltage. The switching threshold voltage of the inverter 252 is set to approximately. 2.5 volts, and not to a midpoint between the high and low voltage "rails" connected to the inverter. Because this Vmid voltage is applied to the gate of the transistor 254, the transistor 254 turns ON, pulling the drain of the transistor 264 to a ground reference. This ground reference is thus applied to the gate of the transitor 262, which causes it to conduct. The drain of the transistor 262 is then brought to about the Vmid voltage, which is also applied to the gate of the transistor 264, which is thus OFF.

The gate of the transistor 270 is pulled to ground through the transistor 254, which turns ON the PMOS transistor 270, and thus causes a voltage equal to about Vmid to be applied to the output node 280.

When even a higher voltage is sensed on the pad 40, such as 5.5 volts, the second portion of the driver circuit 132 operates in the same was as when the voltage signal sensed on the data pad was 4.1 volts, as described above.

Thus, as explained in detail above, when the voltage of the pad 40 is greater than a threshold voltage, which in the described embodiment is 4.0 volts, the driver circuit 132 drives the gate of the pass transistor 130 with approximately the Vmid voltage. Conversely, when the voltage of the pad 40 is less than the threshold voltage, the driver circuit 132 drives the pass transistor 130 with approximately the Vhigh voltage.

As described above with reference to FIG. 5, driving the gate voltage of the pass transistor 130 with a voltage lower than the voltage at the pad 40 limits the voltage level of the voltage passed by the pass transistor 130 from the pad 40 to the data node 120. This protects the I/O buffer 30 and the chip core 20 from overvoltage conditions.

Otherwise, driving the pass transistor at a voltage that is relatively high when compared to the voltage at the pad 40, causes the signal on the pad 40 to be transferred from the pad 40 to the data node 120 through the pass transistor 130 with little or no signal loss.

Another advantage to the operation of the driving circuit 132 illustrated in FIG. 7 is that it works in either direction, i.e., whether the I/O buffer 30 (FIG. 2) is in input or output mode. In the examples above, the external device 50 had a higher threshold voltage than the chip core 20, which, as described above, is the typically situation. The driving circuit 132, however, may also work in the other direction, i.e., by limiting voltage generated by the chip core 20 and sent to the pad 40 through the pass transistor 130. In that mode of operation, the driving circuit 132 behaves just as described above, in that, when the voltage at the data pad 40 rises above the threshold voltage, the driving circuit 132 switches to drive the gate of the pass transistor 130 at a lower voltage, which limits the voltage passing through the pass transistor 130.

Figure 8:
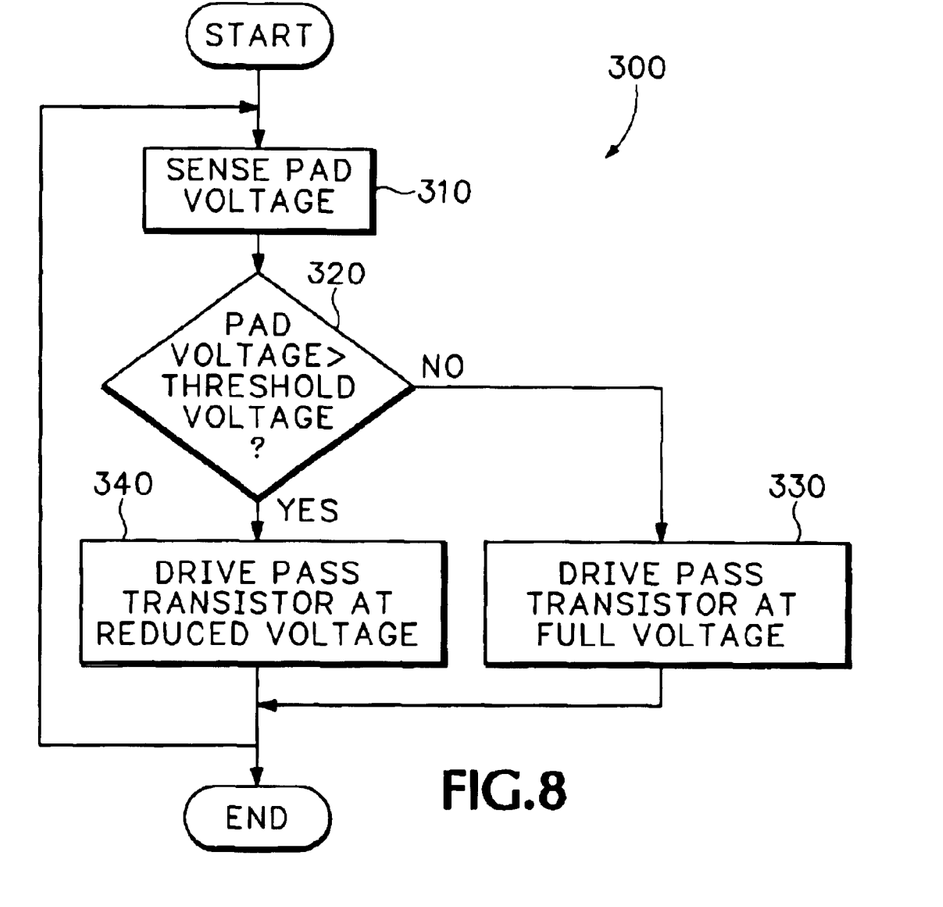
FIG. 8 is an example flow diagram illustrating processes that may be performed by embodiments of the invention.

FIG. 8 is an example flow diagram illustrating processes that may be performed by embodiments of the invention. A Flow 300 begins by sensing the voltage of the data pad 40 in a process 310. Once the voltage of the data pad 40 is sensed, it is compared to a threshold voltage in a process 320. There are many ways to compare voltages, e.g., by using a differential amplifier or a threshold monitor. As shown in FIG. 7, one type of threshold monitor is the inverter 210 having its threshold set at the desired threshold voltage. In the example explained with reference to FIG. 7, the threshold voltage is set at approximately 3.75 volts.

If the voltage at the data pad 40 is less than the threshold voltage, the flow 300 exits the process 320 in the NO direction, and proceeds to a process 330. In the process 330, the driving circuit 132 drives the pass transistor 130 at a voltage that ensures the data signal is not attenuated when it passes through the pass transistor 130. Because voltage attenuation through a pass transistor is related to the gate and threshold voltages of the pass transistor, by driving the pass transistor 130 with a high gate voltage, the voltage signal is transferred between the data node 120 and the pad 40 without significant voltage loss. In some embodiments of the invention the driving circuit 132 drives the gate of the pass transistor 130 at a level at least a threshold voltage level higher than the voltage at the data node 120 or the data pad 40, based on which direction data is traveling through the I/O buffer 30. For example, if the I/O buffer 30 is accepting a voltage of 3.3 volts at the pad 40 from an external device 50 (FIG. 2), because the pad voltage is less than the threshold voltage of 3.75 volts, the driving circuit 132 will drive the pass transistor at about 5.0 volts. Therefore, as described with reference to FIG. 6, the driving circuit 132 will drive the gate of the pass transistor 130 at about 5.0 volts, which causes the pass transistor 130 to carry the voltage from the pad 40 to the data node 120 with little or no voltage loss.

Conversely, when the pad 40 is greater than the threshold voltage, the driving circuit 132 drives the pass transistor 130 so as to be a voltage limiter, in a process 340. As described above, one way to perform this is to drive the gate of the pass transistor 130 with a Vmid voltage (3.3 volts) if the voltage at the pad 40 is above the threshold voltage (3.75 volts). This limits the voltage transferred from the pad 40 to the data node 120 (FIG. 5) to between about 2.9 to about 3.1 volts.

As illustrated in FIG. 8, the flow 300 may be performed as a continuous operation, i.e., the voltage at the pad 40 is constantly being monitored. In other embodiments, the voltage at the pad may be monitored on at certain times or under certain conditions, for example only when the I/O buffer 40 is in input mode.

Embodiments of the invention provide many advantages over prior art I/O buffer circuits. One benefit provided is the way to automatic limit voltage received from a pad when the voltage exceeds a preset threshold amount. Of course, although the detailed description set out herein described sample voltages and operations the sample voltages are not limiting to the invention, which may work with many different types of voltages. For example, voltages other than those already described could be used to drive the PMOS and NMOS transistors 112 and 114. Also, different threshold voltages could be used in the driver circuit 132. Additionally, a specific example of the driver circuit was set out in FIG. 7, but the driver circuit could be implemented in many other ways without deviating from the spirit of the invention.

Those skilled in the art recognize that the data buffer described herein may be implemented in many different variations. Therefore, although various embodiments are specifically illustrated and described herein, it will be appreciated that modifications and variations of the present invention are covered by the above teachings and within the purview of the appending claims without departing from the spirit and intended scope of the invention.

What is claimed is:

1. A circuit comprising:
   a data input terminal;
   a pull-up circuit and a pull-down circuit coupled to the data input terminal; and
   a data node formed at a junction of the pull-up circuit and the pull-down circuit;
   wherein the pass transistor is operative when the circuit is in a data input mode and in a data output mode; and
   wherein the pull-up circuit is structured to be driven by a static voltage.

2. The circuit of claim 1 wherein the pull-up circuit comprises first and second serially coupled transistors.

3. The circuit of claim 2 wherein the first transistor is structured to be driven by a transistor driving circuit coupled to the data input terminal.

4. The device of claim 1 wherein the driving circuit comprises:
   a first voltage input to receive a first power supply voltage;
   a second voltage input to receive a second power supply voltage, the second power supply voltage higher than the first power supply voltage;
   an input terminal structured to receive a voltage level signal from a data pad;
   a voltage sensor coupled to the input terminal and structured to generate a control signal based on the voltage level of the data pad;
   a control circuit coupled to the voltage sensor and structured to generate an output signal responsive to the control signal.

5. The device of claim 4 wherein the control circuit is coupled to the first voltage input and to the second voltage input, the control circuit structured to generate the output signal from the first power supply voltage or from the second power supply voltage, responsive to the control signal.

6. The device of claim 5 wherein, when the pad voltage is above a threshold voltage, the control circuit generates the output signal from the first power supply voltage.

7. The circuit of claim 1 comprising:
   a pass transistor coupled between the data node and a data pad; and
   a driving circuit structured to drive the pass transistor.

8. A circuit, comprising:
   a data input terminal;
   a pull-up circuit and a pull-down circuit coupled to the data input terminal;
   a data node formed at a junction of the pull-up circuit and the pull-down circuit;
   a pass transistor coupled between the data node and a data pad; and
   a driving circuit structured to drive the pass transistor;
   wherein the pass transistor is operative when the circuit is in a data input mode and in a data output mode;
   wherein the pull-up circuit comprises first and second serially coupled transistors;
   wherein the first transistor is structured to be driven by a transistor driving circuit coupled to the data input terminal; and
   wherein the second transistor is structured to be driven by a static voltage.

9. The circuit of claim 8 wherein the data input terminal is coupled to a circuit core, and wherein the static voltage is a power supply voltage of the circuit core.

10. A method comprising:
    sensing a voltage at a data pad;
    when the sensed voltage is below a threshold value, driving a pass transistor coupled to the data pad with a first driving signal; and
    when the sensed voltage is above the threshold value, driving the pass transistor with a second driving signal;
    wherein driving a pass transistor with a first driving signal comprises driving a pass transistor with a static voltage having a first value.

11. The method of claim 10 wherein driving a pass transistor with a second driving signal comprises driving a pass transistor with a static voltage having a second voltage value, the second voltage value less than the first voltage value.

12. The method of claim 11 wherein the second voltage value is a value between a power supply voltage of a device that generated a data signal at the data pad and a power supply voltage of a device that is using the data signal from the data pad.

13. The method of claim 10 further comprising, before sensing a voltage at a data pad, driving a data signal to the data pad.

* * * * *